US010263601B2

(12) United States Patent
Bradley (10) Patent No.: US 10,263,601 B2
(45) Date of Patent: Apr. 16, 2019

(54) TUNABLE BULK ACOUSTIC RESONATOR DEVICE WITH IMPROVED INSERTION LOSS

(71) Applicant: Avago Technologies General IP (Singapore) Pte. Ltd., Singapore (SG)

(72) Inventor: Paul Bradley, Los Altos, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 179 days.

(21) Appl. No.: 15/339,158

(22) Filed: Oct. 31, 2016

(65) Prior Publication Data

US 2018/0123562 A1    May 3, 2018

(51) Int. Cl.
| H03H 9/60 | (2006.01) |
| H03H 9/54 | (2006.01) |
| H02M 3/07 | (2006.01) |
| H03H 9/02 | (2006.01) |

(52) U.S. Cl.
CPC .............. H03H 9/605 (2013.01); H02M 3/07 (2013.01); H03H 9/54 (2013.01); *H03H 2009/02196* (2013.01)

(58) Field of Classification Search
CPC . H03H 2009/02196; H03H 9/605; H03H 9/54
USPC ................ 333/17.1, 133, 187, 188; 310/315
See application file for complete search history.

(56) References Cited

U.S. PATENT DOCUMENTS

| 5,446,306 | A | * | 8/1995 | Stokes | ............... | H03H 9/02102 |
| | | | | | | 257/416 |
| 5,587,620 | A | | 12/1996 | Ruby et al. | | |
| 5,873,153 | A | | 2/1999 | Ruby et al. | | |
| 6,107,721 | A | | 8/2000 | Lakin | | |
| 6,384,697 | B1 | | 5/2002 | Ruby | | |
| 6,507,983 | B1 | | 1/2003 | Ruby et al. | | |
| 6,548,943 | B2 | | 4/2003 | Kaitila et al. | | |
| 6,828,713 | B2 | | 12/2004 | Bradley et al. | | |

(Continued)

FOREIGN PATENT DOCUMENTS

| CN | 101594140 A | 12/2009 |
| CN | 103326689 A | 9/2013 |

OTHER PUBLICATIONS

English translation of CN101594140, Published on Dec. 2, 2009.
English translation of CN103326689A, Published on Sep. 25, 2013.

*Primary Examiner* — Robert J Pascal
*Assistant Examiner* — Jorge L Salazar, Jr.

(57) ABSTRACT

A tunable BAW filter device operating in an allocated channel of a predetermined frequency band includes a voltage source and multiple BAW resonators. The voltage source selectively provides non-zero DC bias voltage based on a location of the allocated channel within the frequency band. Each BAW resonator has a resonance frequency, and includes a bottom electrode, a piezoelectric layer and a top electrode disposed over the piezoelectric layer, the top electrode being electrically connected to the voltage source via a resistor. The voltage source is activated, applying the non-zero DC bias voltage to the top electrode of each BAW resonator, when the location of the allocated channel is near an upper or lower corner of the frequency band. The resonance frequency of each BAW resonator is shifted in response to the non-zero DC bias voltage toward a center of the frequency band, improving insertion loss of the BAW filter device.

22 Claims, 5 Drawing Sheets

(56) References Cited

U.S. PATENT DOCUMENTS

| | | | |
|---|---|---|---|
| 7,098,575 B2 * | 8/2006 | Mehta | H03H 9/174 310/320 |
| 7,275,292 B2 | 10/2007 | Ruby et al. | |
| 7,280,007 B2 | 10/2007 | Feng et al. | |
| 7,345,410 B2 | 3/2008 | Grannen et al. | |
| 7,358,831 B2 | 4/2008 | Larson, III et al. | |
| 7,369,013 B2 | 5/2008 | Fazzio et al. | |
| 7,388,454 B2 | 6/2008 | Ruby et al. | |
| 7,561,009 B2 | 7/2009 | Larson, III et al. | |
| 7,629,865 B2 | 12/2009 | Ruby | |
| 7,714,684 B2 | 5/2010 | Ruby et al. | |
| 7,791,434 B2 | 9/2010 | Fazzio et al. | |
| 8,188,810 B2 | 5/2012 | Fazzio et al. | |
| 8,230,562 B2 | 7/2012 | Fazzio et al. | |
| 8,248,185 B2 | 8/2012 | Choy et al. | |
| 8,436,516 B2 | 5/2013 | Ruby et al. | |
| 8,902,023 B2 | 12/2014 | Choy et al. | |
| 8,981,876 B2 | 3/2015 | Jamneala et al. | |
| 9,197,185 B2 | 11/2015 | Zou et al. | |
| 9,243,316 B2 | 1/2016 | Larson, III et al. | |
| 2006/0001329 A1 | 1/2006 | Rao et al. | |
| 2007/0205850 A1 | 9/2007 | Jamneala et al. | |
| 2007/0210879 A1 * | 9/2007 | Cardona | H03H 9/172 333/188 |
| 2010/0327697 A1 | 12/2010 | Choy et al. | |
| 2010/0327994 A1 | 12/2010 | Choy et al. | |
| 2011/0180391 A1 | 7/2011 | Larson, III et al. | |
| 2011/0266925 A1 | 11/2011 | Ruby et al. | |
| 2012/0177816 A1 | 7/2012 | Larson, III et al. | |
| 2012/0256706 A1 * | 10/2012 | Sakashita | H03H 3/02 333/187 |
| 2012/0326807 A1 | 12/2012 | Choy et al. | |
| 2013/0015747 A1 | 1/2013 | Ruby et al. | |
| 2013/0049545 A1 | 2/2013 | Zou et al. | |
| 2013/0141177 A1 * | 6/2013 | Narathong | H01F 21/12 331/117 FE |
| 2014/0118090 A1 | 5/2014 | Grannen et al. | |
| 2014/0132117 A1 | 5/2014 | Larson, III | |
| 2014/0175950 A1 | 6/2014 | Zou et al. | |
| 2014/0225682 A1 | 8/2014 | Burak et al. | |
| 2014/0292150 A1 | 10/2014 | Zou et al. | |
| 2014/0354109 A1 | 12/2014 | Grannen et al. | |
| 2015/0207489 A1 | 7/2015 | Bi et al. | |
| 2015/0244347 A1 | 8/2015 | Feng et al. | |
| 2015/0311046 A1 | 10/2015 | Yeh et al. | |

\* cited by examiner

TUNABLE BULK ACOUSTIC RESONATOR DEVICE WITH IMPROVED INSERTION LOSS

BACKGROUND

Acoustic resonators are widely incorporated in electronic devices to implement signal processing functions. For example, cellular telephones, personal digital assistants (PDAs), electronic gaming devices, laptop computers and other mobile devices may use acoustic resonators to implement frequency filters (e.g., band pass filters) for transmitted and/or received radio frequency (RF) signals. Such filters include ladder filters, for example, having electrically connected series and shunt acoustic resonators formed in a ladder structure. The filters may be included in a duplexer, for example, connected between a single antenna and a receiver and a transmitter for respectively filtering received and transmitted RF signals.

Different types of acoustic resonators can be used according to different applications, including bulk acoustic wave (BAW) resonators, such as thin film bulk acoustic resonators (FBARs) and solidly mounted resonators (SMRs). An FBAR, for example, includes a piezoelectric layer between a first (bottom) electrode and a second (top) electrode formed over a cavity in a substrate. FBARs resonate at GHz frequencies, and are thus relatively compact, having thicknesses on the order of microns, and length and width dimensions of hundreds of microns.

Acoustic resonators used as band pass filters (such as ladder filters, mentioned above) have associated passbands that provide ranges of frequencies permitted to pass through the filters. For example, a multiplexer formed by two filter circuits (which may be referred to as a duplexer) accommodates two signal paths (e.g., a receive path from a common antenna to a receiver and a transmit path from a transmitter to the common antenna). Each of the filter circuits is a band pass filter with a corresponding passband. Accordingly, the receiver is able to receive signals through a receive frequency passband, and the transmitter is able to send transmit signals through a different transmit frequency passband, while filtering out the other frequencies. Other types of filters may have more or fewer than two filter circuits and signal paths, depending on various factors, such as the number signals and their respective frequencies that are to be filtered.

The receive and transmit signals may be RF signals corresponding to various predetermined wireless communication standards, such as universal mobile telecommunications system (UMTS), global system for mobile communication (GSM), wideband code division multiple access (WCDMA), Long-Term Evolution (LTE) and LTE-Advanced, for example. The communication standards identify separate frequency bands for transmitting and receiving signals. For example, LTE is allocated various 3GPP bands, including bands 25 and 41, where band 25 provides a transmit (uplink) frequency band of 1850 MHz-1950 MHz and a receive (downlink) frequency band of 1930 MHz-1995 MHz, and band 41 provides a transmit/receive frequency band of 2496 GHz-2690 GHz. Accordingly, a multiplexer operating in compliance with a 3GPP standard would include filters having passbands within the corresponding transmit and receive frequency bands. Throughout this disclosure, a high frequency edge of a frequency band may be referred to as the upper corner (or upper corner frequency), and a low frequency edge of a frequency band may be referred to as the lower corner (or lower corner frequency) of the frequency band.

Each of the frequency bands may be divided into a number of channels, each channel having a carrier center frequency and a channel bandwidth. Depending on implementation of the frequency band, e.g., based on required data rate, the channels may have different channel bandwidths. The wider the channel bandwidth, the fewer channels are available for use within the frequency band. During operation, mobile devices are allocated a particular channel to help avoid interference with other mobile devices using the same frequency band. For example, in a cellular network, a base station may allocate a different channel to each cellular telephone being serviced by that base station.

Generally, the RF signals sent through channels having corresponding center frequencies close to the upper and lower corners of the frequency band tend to have lower quality than the RF signals sent through channels having corresponding center frequencies closer to the center of the frequency band. For example, in the transmit chain, either the signal-to-noise ratio (SNR) is degraded causing lower data rates or more input power must be provided to the filter to achieve the same output power. In the receive chain, the SNR simply is reduced at the band edges (upper and lower frequency corners) where the insertion loss is larger. As the channels having center frequencies becoming closer to the edges of the passbands of the band pass filters in the cellular phones, these channels have worse insertion loss and variation across the band and also larger group delay and group delay variation, both of which contribute to degraded error vector magnitude (EVM). EVM is a measure of signal distortion that causes more errors in digital signal transmission. Therefore, the band pass filters in cellular phones or other mobile devices allocated channels near the upper and lower corners of the frequency band experience higher insertion loss, resulting in degraded signals and low quality communications, than the insertion loss of the band pass filters in mobile devices allocated channels at or closer to the center of the frequency band.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms "a", "an" and "the" include both singular and plural referents, unless the context clearly dictates otherwise. Thus, for example, "a device" includes one device and plural devices. As used in the specification and appended claims, and in addition to their ordinary meanings, the terms "substantial" or "substantially" mean to within acceptable limits or degree. For example, "substantially cancelled" means that one skilled in the art would consider the cancellation to be acceptable. As used in the specification and the appended claims and in addition to its ordinary meaning, the term "approximately" or "about" means to within an acceptable limit or amount to one of ordinary skill in the art. For example, "approximately the same" means that one of ordinary skill in the art would consider the items being compared to be the same.

In the following detailed description, for purposes of explanation and not limitation, specific details are set forth in order to provide a thorough understanding of illustrative embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the illustrative embodiments. Such methods and apparatuses are clearly within the scope of the present teachings.

Generally, it is understood that the drawings and the various elements depicted therein are not drawn to scale. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

BAW resonators, including FBARs and SMRs, have a voltage coefficient of frequency that determines an amount the resonance frequency of the BAW resonator is shifted in response to an DC bias voltage applied to each resonator in an RF acoustic filter, duplexer and/or multiplexer, for example. Generally, according to various embodiments, a high impedance voltage bias network having no loading effect at RF frequencies selectively applies a DC bias voltage (e.g., approximately +90 or approximately −90 volts) to (top) electrodes of BAW resonators (e.g., FBARs) in an acoustic filter. This DC bias voltage may be provided by a charge pump circuit implemented in a high voltage complementary metal-oxide-semiconductor (CMOS) process at low cost, for example. In an embodiment, a high resistance layer may be added to the BAW resonator fabrication process to provide DC bias network with low impact to the RF performance.

According to a representative embodiment, a tunable BAW filter device, operating in an allocated channel of a predetermined frequency band having a plurality of channels, includes a first voltage source and multiple BAW resonators. The first voltage source selectively provides a non-zero DC bias voltage based on a location of the allocated channel within the predetermined frequency band. The BAW resonators are configured to provide a passband of the BAW filter device. Each BAW resonator has a corresponding resonance frequency and comprises a bottom electrode disposed over a substrate and an acoustic reflector, a piezoelectric layer disposed over the bottom electrode and having a corresponding resonance frequency, and a top electrode disposed over the piezoelectric layer, the top electrode being electrically connected to the first voltage source via a first resistor. The first voltage source is controlled to apply the non-zero DC bias voltage to the top electrode of each BAW resonator, when the location of the allocated channel is near an upper corner or a lower corner of the predetermined frequency band, where the upper corner corresponds to a high frequency edge of the predetermined frequency band and the lower corner corresponds to a low frequency edge of the predetermined frequency band. The resonance frequency of each BAW resonator is shifted in response to the non-zero DC bias voltage toward a center of the predetermined frequency band, improving insertion loss of the BAW resonator device.

The high impedance voltage bias network may be used to shift a minimum insertion loss portion of a passband of the acoustic filter to the carrier frequency in use, thereby improving (i.e., reducing) insertion loss of the acoustic filter and reducing current consumption in the device (e.g., cellular telephone or other mobile device). That is, the worst-case filter insertion loss of a particular acoustic band pass filter is improved by shifting the frequency response up or down in frequency depending whether the insertion loss needs to be improved (due to using a channel at a band edge) at the high side or the low side of the passband. Such improvement of insertion loss by frequency shifting is especially significant when the frequencies (e.g., in allocated channels) are crowded into the upper or lower corner frequencies of the band, where insertion loss of an acoustic filter worsens.

The described embodiments relate generally to bulk acoustic wave (BAW) resonator devices, including thin film bulk acoustic wave resonators (FBARs) and solidly mounted resonators (SMRs), for example, although much of the discussion is directed to FBARs for the sake of convenience. Certain details of acoustic resonator devices, including materials and methods of fabrication, may be found in one or more of the following commonly owned U.S. Patents and Patent Applications: U.S. Pat. No. 6,107,721 to Lakin; U.S. Pat. Nos. 5,587,620, 5,873,153, 6,507,983, 6,384,697, 7,388,454, 7,714,684, and 8,436,516 to Ruby et al.; U.S. Pat. Nos. 7,369,013, 7,791,434, 8,188,810 and 8,230,562 to Fazzio et al.; U.S. Pat. No. 7,280,007 to Feng et al.; U.S. Pat. Nos. 8,248,185, and 8,902,023 to Choy et al.; U.S. Pat. No. 7,345,410 to Grannen, et al.; U.S. Pat. No. 6,828,713 to Bradley et al.; U.S. Pat. Nos. 7,561,009, 7,358,831, 9,243,316 to Larson, III et al.; U.S. Pat. No. 9,197,185 to Zou et al., U.S. Patent Application Publication No. 2012/0326807 to Choy et al.; U.S. Pat. No. 7,629,865 to Ruby; U.S. Patent Application Publications Nos. 2011/0180391, and 2012/0177816 to Larson III, et al.; U.S. Patent Application Publication No. 2014/0132117 to Larson III; U.S. Patent Application Publication No. 2007/0205850 to Jamneala et al.; U.S. Patent Application Publication No. 2011/0266925 to Ruby et al.; U.S. Patent Application Publication No. 2013/0015747 to Ruby et al.; U.S. Patent Application Publication No. 2013/0049545 to Zou et al.; U.S. Patent Application Publication No. 2014/0225682 to Burak, et al.; U.S. Patent Publication Nos. 2014/0118090 and 2014/0354109 to Grannen et al.; U.S. Patent Application Publication Nos. 2014/0292150, and 2014/0175950 to Zou et al.; U.S. Patent Application Publication No. 2015/0244347 to Feng et al.; U.S. Patent Application Publication 2015/0311046 to Yeh et al.; and U.S. Patent Application Publication 2015/0207489 to Bi et al. The entire disclosures of each of the patents, and patent application publications listed above are hereby specifically incorporated by reference. It is emphasized that the components, materials and methods of fabrication described in these patents and patent applications are representative, and other methods of fabrication and materials within the purview of one of ordinary skill in the art are also contemplated.

Figure 1A:
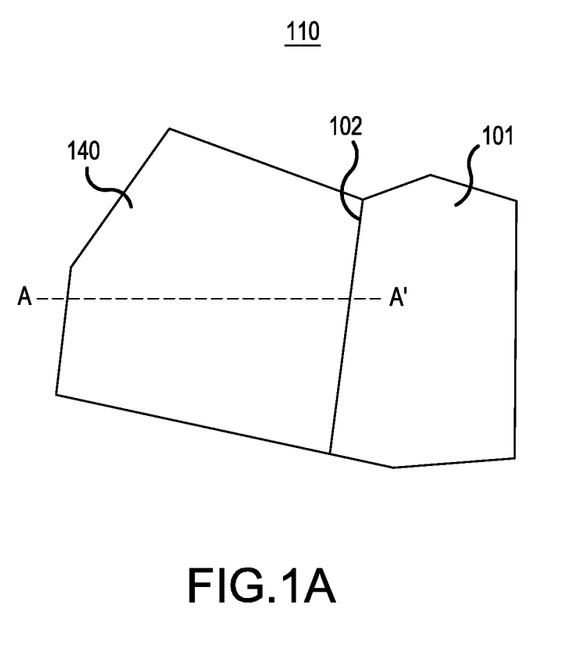
FIG. 1A is a simplified top perspective view illustrating a BAW resonator, according to a representative embodiment.

FIG. 1A is a top perspective view illustrating a BAW resonator, according to a representative embodiment.

Referring to FIG. 1A, BAW resonator 110 includes an acoustic stack having an apodized pentagonal structure, i.e. an asymmetric pentagon, to distribute spurious mode density over a frequency range and to avoid strong excitation of any of spurious modes at any one frequency. In general, acoustic resonator shape is not limited to five sides. For example, common alternative designs include quadrilaterals, hexagons, and other shapes, without departing from the scope of the present teachings. BAW resonator 110 comprises a top (second) electrode 140, a connection side 101, and an interconnect 102. The connection side 101 is configured to provide an electrical connection to interconnect 102. The interconnect 102 provides electrical signals to top electrode 140 to excite desired acoustic waves in a piezoelectric layer (not shown in FIG. 1A) of BAW resonator 110.

Figure 1B:
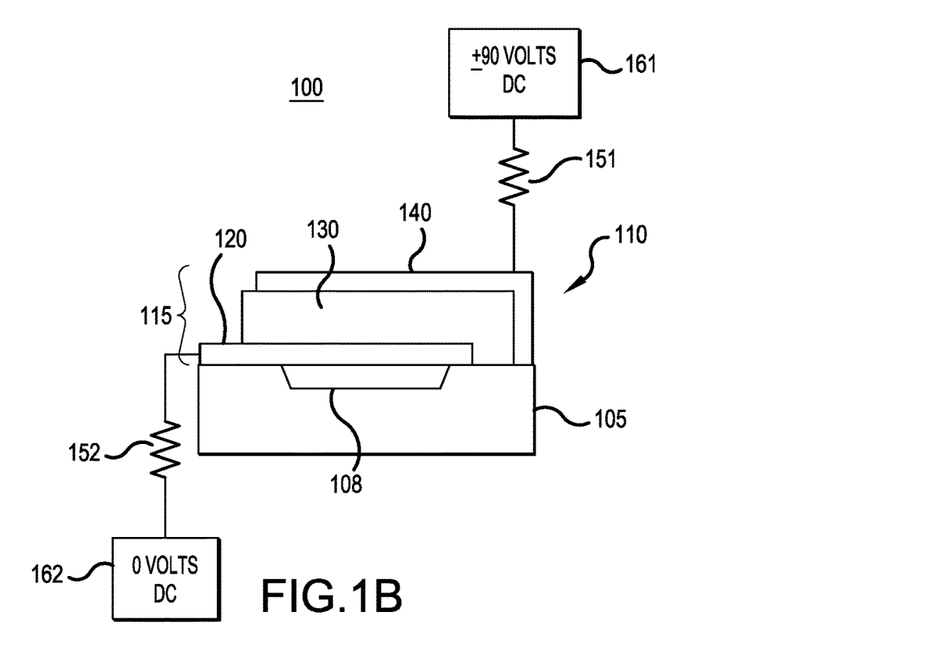
FIG. 1B is a simplified schematic diagram illustrating an acoustic resonator device, including an acoustic resonator and direct current (DC) bias voltage sources for shifting resonance frequency of the acoustic resonator, according to a representative embodiment.

FIG. 1B is a simplified schematic diagram illustrating an acoustic resonator device, including an acoustic resonator and DC bias voltage sources for shifting resonance frequency of the acoustic resonator, according to a representative embodiment. FIG. 1B includes a cross-section view of the BAW resonator 110 taken along line A-A' in FIG. 1A.

Referring to FIG. 1B, BAW resonator device 100 comprises the BAW resonator 110, first bias resistor 151, second bias resistor 152, first DC voltage source 161 and second DC voltage source 162. In the depicted illustrative embodiment, the BAW resonator 110 is an FBAR that includes a substrate 105 and an acoustic stack 115 formed on the substrate 105 over an air cavity 108 (e.g., "swimming pool") in the substrate 105. The substrate 105 may be formed of various types of semiconductor materials compatible with semiconductor processes, such as silicon (Si), gallium arsenide (GaAs), indium phosphide (InP), or the like, which may be useful for integrating connections and electronics, dissipating heat generated from the resonator, generally reducing size and cost of the BAW resonator 110, and also enhancing performance.

The air cavity 108 is an acoustic reflector defined by the substrate 105 and is located below acoustic stack 115 to allow free vibration of acoustic stack 115 during operation. The air cavity 108 is typically formed by etching substrate 105 and depositing a sacrificial material therein prior to formation of acoustic stack 115, thereby filling the cavity 108 with the sacrificial material. The sacrificial material is ultimately removed, e.g., by wet or dry release process, subsequent to the formation of acoustic stack 115. Various illustrative fabrication techniques for an air cavity in a substrate are described by U.S. Pat. No. 7,345,410 (Mar. 18, 2008), to Grannen et al., which is hereby incorporated by reference in its entirety. As an alternative to air cavity 108, BAW resonator 110 could include an acoustic mirror, such as a distributed Bragg reflector (DBR), for example (in which case the BAW resonator 110 would be an SMR), with acoustic impedance layers having different acoustic impedances, respectively. An acoustic mirror may be fabricated according to various techniques, an example of which is described in U.S. Pat. No. 7,358,831 to Larson, III, et al., which is hereby incorporated by reference.

The acoustic stack 115 comprises a bottom (first or lower) electrode 120 disposed over the substrate 105 and the air cavity 108, a piezoelectric layer 130 disposed over the bottom electrode 120, and a top (second or upper) electrode 140 disposed over the piezoelectric layer 130. Each of the bottom electrode 120 and the top electrode 140 may be formed of a conductive material (e.g., a metal), such as molybdenum (Mo), tungsten (W), aluminum (Al), platinum (Pt), ruthenium (Ru), niobium (Nb), or hafnium (Hf), for example. The thickness of the bottom electrode 120 and the top electrode 140 may range from about 600 Å to about 30,000 Å, for example. The piezoelectric layer 130 may be formed of a thin film piezoelectric material compatible with semiconductor processes, such as aluminum nitride (AlN), zinc oxide (ZnO), lead zirconium titanate (PZT), or the like. The thickness of the piezoelectric layer 130 may range from about 1000 Å to about 100,000 Å, for example. Of course, the thicknesses of the bottom electrode 120 and the top electrode 140, and of the piezoelectric layer 130, may vary to provide unique benefits for any particular situation or to meet application specific design requirements of various implementations, as would be apparent to one of ordinary skill in the art.

In an embodiment, the piezoelectric layer 130 may be formed on a seed layer (not shown) disposed over a top surface of the bottom electrode 120. For example, the seed layer may be formed of Al to foster growth of an AlN piezoelectric layer 130. The seed layer may have a thickness in the range of about 50 Å to about 5000 Å, for example. The BAW resonator 110 may further include a passivation layer (not shown) formed over the top electrode 140. The passivation layer may be formed of various types of materials, including AlN, silicon carbide (SiC), non-etchable boron-doped silicon glass (NEBSG), silicon dioxide ($SiO_2$), silicon nitride (SiN), polysilicon, and the like. The thickness of the passivation layer should generally be sufficient to protect the layers of acoustic stack 115 from moisture and/or chemical reactions with substances that may enter through a leak in a package.

The top electrode 140 is electrically connected to the first DC voltage source 161 through a first resistor 151, and the bottom electrode 120 is electrically connected the second DC voltage source 162 through a second resistor 152. The first DC voltage source 161 provides a first DC bias voltage with a magnitude having an absolute value (positive or negative) higher than that of a second DC bias voltage provided by the second DC voltage source 162. For example, the first DC voltage source 161 may provide a first DC bias voltage of about +90 volts when activated, while the second DC voltage source 162 may provide a second DC bias voltage of about 0 volts (which is effectively ground voltage in most applications, although it may be common voltage). The values of the DC bias voltages provided by the DC voltage sources may differ to provide unique benefits for any particular situation or to meet application specific design requirements of various implementations, as would be apparent to one of ordinary skill in the art. For example, the first DC bias voltage may be about +70 volts when the first DC voltage source 161 is activated. The first DC voltage source 161 may be implemented as a charge pump circuit implemented in a high voltage CMOS process, for example.

In an alternative embodiment, the second DC voltage source 162 may provide a DC bias voltage with a magnitude having an absolute value greater than 0 volts, but less than the absolute value of the magnitude of the first DC bias voltage. What is relevant here is the DC voltage across the piezoelectric layer 130. The appropriate DC voltage across the piezoelectric layer is most efficiently achieved when either the bottom electrode 120 (or the top electrode 140) is DC connected to ground. Although, as mentioned above, the bottom electrode may be connected to any other voltage supplied by the second DC voltage source 162, as long as the DC voltage difference between bottom and top electrodes 120 and 140 is correct. Depending on the desired magnitudes of these alternative embodiments, the second DC voltage source 162 may likewise be implemented as a charge pump, for example.

Each of the first and second resistors 151 and 152 have high resistance values, for example, greater than or equal to approximately 100 kg. Generally, the resistance values must be high enough so activation of the first and/or second DC voltage source 161 and/or 162 does not to change performance of the BAW resonator 110. This means that no or very little current passes through the first and second resistors 151 and 152. Indeed, very little current consumption is needed, since resistance of the BAW resonator 110 is very high at DC.

The first and second resistors 151 and 152 may be implemented using a resistance layer formed of a high resistance material, such as polysilicon, for example. In alternative embodiments, the first and second resistors 151 and 152 may be provided by the same resistance layer, or by corresponding separate resistance layers, without departing from the scope of the present teachings. Also, the first and second resistors 151 and 152 may have different resistance values, without departing from the scope of the present teachings. When the second DC voltage source 162 is actually ground voltage, there is no need for the second resistor 152 (i.e., the resistance of the second resistor 152 is effectively zero, and the second DC voltage source is connected directly to ground), similar to the configuration shown in FIG. 1C.

Figure 1C:
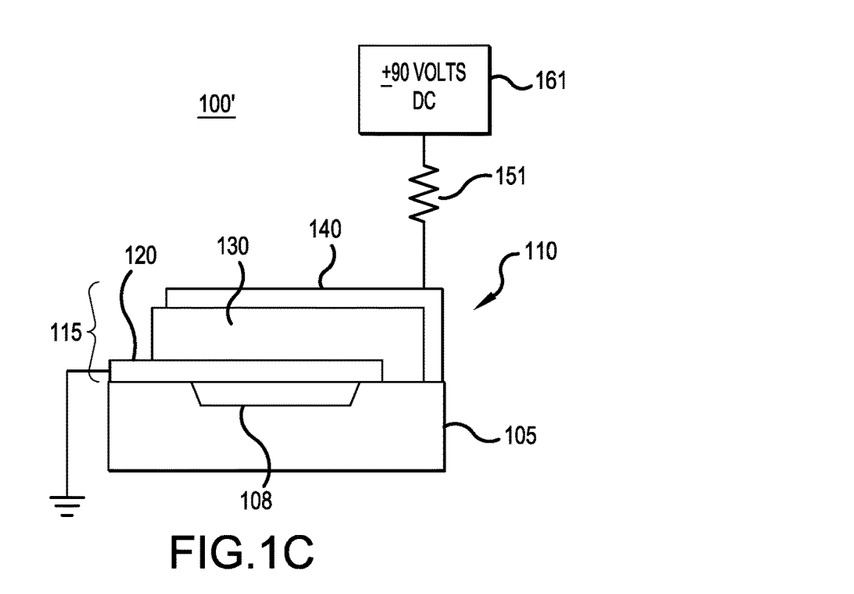
FIG. 1C is a simplified schematic diagram illustrating an acoustic resonator device, including an acoustic resonator and a DC bias voltage source for shifting resonance frequency of the acoustic resonator, according to a representative embodiment.

FIG. 1C, which is a schematic diagram illustrating an acoustic resonator device, including an acoustic resonator and a DC bias voltage source for shifting resonance frequency of the acoustic resonator, according to a representative embodiment, where the bottom electrode 120 of BAW resonator device 100' is simply electrically connected to ground. That is, the BAW resonator device 100' includes the BAW resonator 110, the first DC voltage source 161 and the first resistor 151, but does not include the second DC voltage source 162 or the second resistor 152. As in the case of the second DC voltage source 162 in FIG. 1B providing 0 volts, the frequency shifting in the BAW resonator device 100' is based only on operation of the first DC voltage source 161.

Assuming that the second DC voltage source 162 provides 0 volts or that the bottom electrode 120 is simple connected to ground, for ease of illustration, the first DC voltage source 161 may be activated to provide the first DC bias voltage in order to shift resonance frequency of the BAW resonator 110 by as much as +3 MHz, for example. The BAW resonator 110 has a voltage coefficient of frequency that determines an amount the resonance frequency shifts in response to the applied non-zero first DC bias voltage. For example, the first DC voltage source 161 may have three settings: +90 volts DC, −90 volts DC or 0 (off or disconnected). The first DC voltage source 161 is activated to provide +90 VDC bias voltage in order to shift resonance frequency of the BAW resonator 110 in one direction (higher or lower, depending for example on the configuration of the BAW resonator 110 and the first DC voltage source 161), and is activated to provide −90 VDC bias voltage in order to shift resonance frequency of the BAW resonator 110 in the opposite direction (lower or higher). The first DC voltage source 161 is turned off (or disconnected from the top electrode 140, e.g., using a switch) when the resonance frequency is satisfactory (in the middle of the band where insertion loss is best and group delay variation is minimum), and thus no DC bias voltage is needed.

As mentioned above, acoustic resonators, such as illustrative BAW resonator 110, may be arranged to form a signal filter, such as an RF acoustic band pass filter. As discussed above, the acoustic band pass filter may be included in a mobile device, such as a cellular phone, that is allocated a channel of a plurality of channels in a predetermined frequency band (e.g., LTE band 25 or LTE band 41). Depending on the location of the allocated channel with the frequency band, the resonance frequencies of the acoustic resonators in the acoustic band pass filter, as well as the frequencies of the passband of the acoustic band pass filter, may be shifted in order to minimize insertion loss of the acoustic band pass filter operating in the particular allocated channel.

Figure 2:
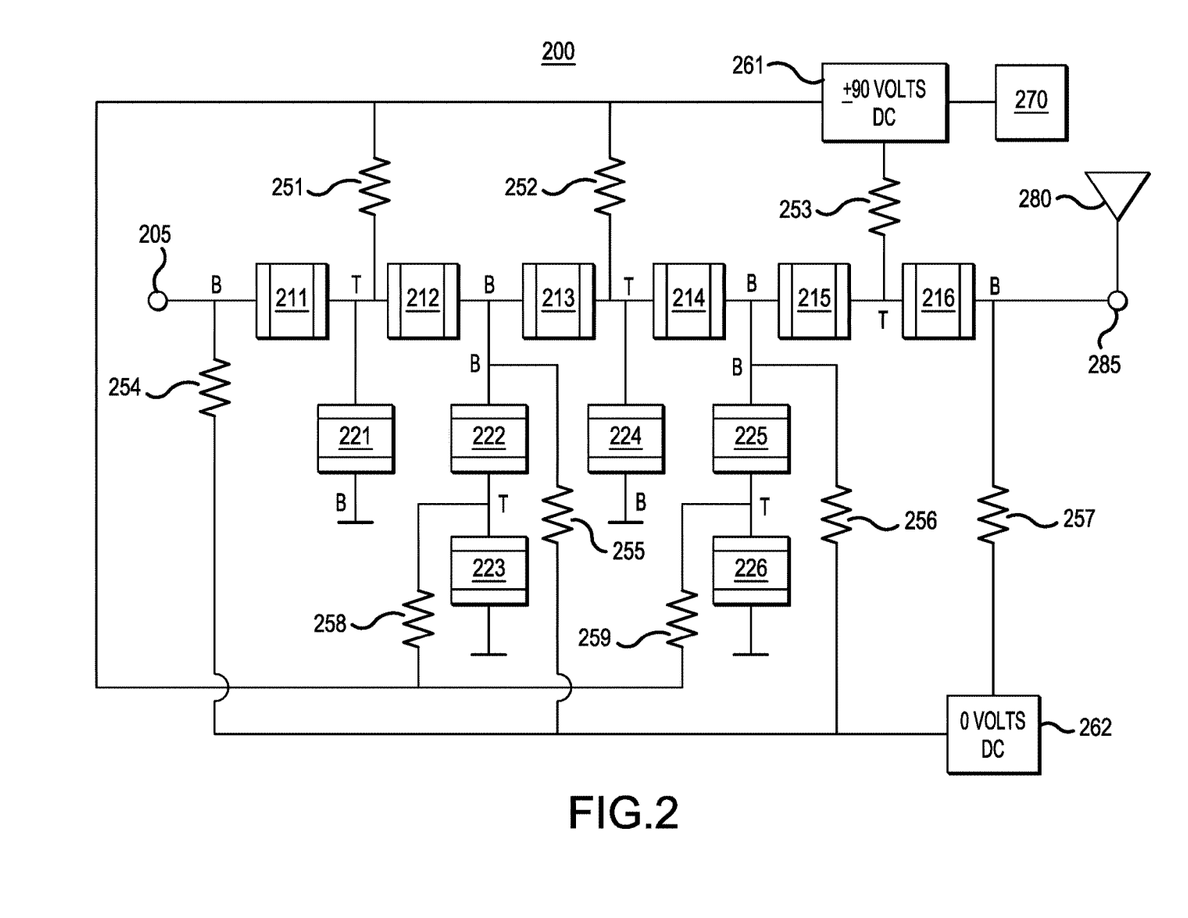
FIG. 2 is a circuit diagram illustrating an acoustic filter device, including acoustic resonators and DC bias voltage sources for shifting resonance frequencies of acoustic resonators and shifting a passband of the acoustic filter device, according to a representative embodiment.

FIG. 2 is a simplified circuit diagram illustrating an acoustic filter device, including acoustic resonators and DC bias voltage sources for shifting resonance frequencies of the acoustic resonators and a passband of the acoustic filter device, according to a representative embodiment.

Referring to FIG. 2, BAW filter device 200 includes a band pass filter comprising series and shunt connected acoustic resonators in a ladder structure. In particular, the BAW filter device 200 includes series FBARs 211, 212, 213, 214, 215 and 216, which are connected in series between terminals 205 and 285 (where terminal 285 is an antenna terminal connected to representative antenna 280, for purposes of illustration). The BAW filter device 200 further includes shunt FBARs 221, 222, 223, 224, 225 and 226, which are connected between adjacent series FBARs and ground or zero volts DC. Each of the series FBARs 211 to 216 and shunt FBARs 221 to 226 have a top electrode (T) and a bottom electrode (B), such as top electrode 140 and bottom electrode 120 discussed above with reference to FIGS. 1B and 1C. Other electronic components common in acoustic band pass filters, such as series and shunt inductors, capacitors and/or resistors, as well as matching networks, are not shown in FIG. 2, for the sake of simplicity.

The BAW filter device 200 is arranged such that the top electrodes of the series FBARs 211 to 216 and shunt FBARs 221 to 226 are connected to adjoining top electrodes, and the bottom electrodes of the series FBARs 211 to 216 and shunt FBARs 221 to 226 are connected to adjoining bottom electrodes, of other series FBARs 211 to 216 and shunt FBARs 221 to 226. Each of the top electrodes are connected to a first DC voltage source 261 (e.g., ±90 volts DC) through a high resistance, and each of the bottom electrodes is connected to a second DC voltage source 262 (e.g., 0 volts DC) through a high resistance or is connected directly to ground (e.g., zero or negligible resistance).

Thus, in particular, each of the series FBARs 211, 212 and the shunt FBAR 221 has a top electrode connected to the first DC voltage source 261 through resistor 251; each of the series FBARs 213, 214 and the shunt FBAR 224 has a top electrode connected to the first DC voltage source 261 through resistor 252; and each of the series FBARs 215 and 216 has a top electrode connected to the first DC voltage source 261 through resistor 253. The series FBAR 211 has a bottom electrode connected to the second DC voltage source 262 through resistor 254; each of the series FBARs 212, 213 and the shunt electrode 222 has a bottom electrode connected to the second DC voltage source 262 through resistor 255; each of the series FBARs 214, 215 and the shunt electrode 225 has a bottom electrode connected to the second DC voltage source 262 through resistor 256; and the series FBAR 215 has a bottom electrode connected to the second DC voltage source 262 through resistor 257. Further, each of the shunt FBARs 222 and 223 has a top electrode connected to the first DC voltage source 261 through resistor 258; and each of the shunt FBARs 225 and 226 has a top electrode connected to the first DC voltage source 261 through resistor 259. Each of the shunt FBARs 221, 223, 224 and 226 has a bottom electrode connected to ground.

In an embodiment, the series FBARs 211 to 216 and the shunt FBARs 221 to 226 may be formed on a dielectric layer (not shown) to prevent the semiconductor substrate (e.g., substrate 105 in FIGS. 1A and 1B) from becoming electrically conductive. The electric field in the semiconductor substrate is still high when the top electrodes of the FBARS are at high voltage, even when the bottom electrodes are grounded. This may cause the semiconductor substrate to become a non-linear conductor, which is not good for IMD and quality factor of the corresponding FBARs. The dielectric layer may be formed of silicon dioxide ($SiO_2$) at about 3 μm to about 6 μm in thickness, for example. Also, in an embodiment, the second DC voltage source 262 provides 0 volts, or is ground voltage. In this case, the bottom electrodes may be connected directly to ground, and thus there would be no need for the resistors 254, 255, 256 or 257, as discussed above with reference to FIG. 1C.

For purposes of illustration, each of the resistors 251 to 257 has the same high resistance (e.g., approximately 100 kΩ). Of course, the resistance value may vary to provide unique benefits for any particular situation or to meet application specific design requirements of various implementations, as would be apparent to one skilled in the art. Notably, the resistors 251 to 257 may have the same resistance values because the resistors 251 to 257 may be realized by a common resistance layer, as discussed below with reference to FIG. 3. However, the resistance values of the resistors 251 to 257 may differ from one another, without departing from the scope of the present teachings. For example, the resistors 251, 252, 253, 258 and 259, all of which are connected between FBAR top electrodes and the first DC voltage source 261, may be implemented using one common resistance layer, while the resistors 254, 255, 256 and 257, all of which are connected between FBAR bottom electrodes and the second DC voltage source 262, may be implemented using another common resistance layer (having the same or different resistance value). Also, each of the resistors 251, 252, 253, 258 and 259 has a resistance value large enough to isolate each of the corresponding series BAW resonators 211 to 216 and shunt BAW resonators 221 to 226 at RF, and small enough to enable the top electrode of each of the corresponding series BAW resonators 211 to 216 and shunt BAW resonators 221 to 226 to reach the non-zero DC bias voltage when the first DC voltage source 261 is activated. In the discussion below, it is assumed for ease of illustration that the second DC voltage source 262 provides 0 volts or is ground voltage, and therefore the resistors 254, 255, 256 or 257 have negligible values.

Generally, the BAW filter device 200 is tunable in response to the location of the channel allocated to the BAW filter device 200 within the predetermined frequency band. In the depicted embodiment, the BAW filter device 200 further includes a detector 270 that determines when the location of the allocated channel is near the upper corner or the lower corner of the frequency band. For purposes of this disclosure, a channel is "near" the upper corner or the lower corner of the frequency band when the channel includes frequency spectrum in the upper or lower approximately ten percent of the frequency band. These channels benefit most from the frequency tuning. The remaining channels, which include no spectrum in the upper or lower approximately ten percent of the frequency band, generally do not require tuning since they are located in the middle portion of the frequency band. Under some circumstances, the disclosed frequency tuning benefit from a smaller frequency range. For example, in an embodiment, a channel is "near" the upper corner or the lower corner of the frequency band when the channel includes frequency spectrum in the upper or lower approximately five percent of the frequency band. Of course, the percentage ranges may vary to provide unique benefits for any particular situation or to meet application specific design requirements of various implementations, as would be apparent to one skilled in the art.

The detector 270 may detect the location of the allocated channel in a number of ways, without departing from the scope of the present teachings. For example, when the base station servicing the mobile device containing the BAW filter device 200 allocates the channel, it may include a flag in the signal to the mobile device indicating that the allocated channel has at least a portion of its spectrum in the upper ten percent or the lower ten percent of the frequency band. In other words, the detector 270 receives the flag, indicating that the allocated channel is near the upper or lower corner of the frequency band, and controls (e.g., activates or triggers) the first DC voltage source 261 to generate ±90 volts DC. Alternatively, the detector may activate a switch (not shown) that connects the first DC voltage source 261, generating +90 VDC or -90 VDC, to the top electrodes of the BAW filter device 200.

For example, the detector 270 activates the first DC voltage source 261 to generate +90 VDC bias voltage when the flag indicates that the allocated channel is near the lower corner of the frequency band. This shifts the resonance frequencies of the series FBARs 211 to 216 and shunt FBARs 221 to 226, and thus the passband of the acoustic resonator, to higher frequencies (toward a center of the frequency band). The detector 270 activates the first DC voltage source 261 to generate -90 VDC bias voltage when the flag indicates that the allocated channel is near the upper corner of the frequency band. This shifts the resonance frequencies of the series FBARs 211 to 216 and shunt FBARs 221 to 226, and thus the passband of the acoustic resonator, to lower frequencies. Shifting these frequencies toward the center of the frequency band improves (i.e., reduces) insertion loss of the BAW filter device 200. When the detector 270 does not receive a flag, the first DC voltage source is not activated and thus remains at 0 VDC.

In the embodiment described above, the detector 270 may be implemented as a simple processing unit, a latch or a switch since the flag sent by the base station provides the information necessary to determine whether to activate the first DC voltage source 261 and, if so, whether the first DC voltage source 261 should generate positive or negative DC bias voltage. In alternative embodiments, the detector 270 (as opposed to the servicing base station, for example) may be configured to identify the location of the channel, to determine whether the channel includes spectrum in the upper or lower ten percent of the frequency band, and/or whether to control the first DC voltage source 261 to apply positive or negative DC bias voltage (or leave it turned off or at 0 volts). In order to perform one or more of these more sophisticated actions, the detector 270 may be implemented as a processing unit, either a dedicated processing unit for tuning the BAW resonator filter, or a processing unit that controls overall functionality of the mobile device, for example.

The processing unit may be implemented by a computer processor, field-programmable gate arrays (FPGAs), application specific integrated circuits (ASICs), using software, firmware, hard-wired logic circuits, or combinations thereof. A computer processor, in particular, may be constructed of any combination of hardware, firmware or software architectures, and may include its own memory (e.g., nonvolatile memory) for storing executable software and/or firmware executable code that allows it to perform the various functions. In an embodiment, the computer processor may comprise a central processing unit (CPU), for example, executing an operating system. A memory (not shown) may be implemented by any number, type and combination of random access memory (RAM) and read-only memory (ROM), for example, and may store various types of information, such as computer programs and software algorithms executable by the computer processor (and/or other components), including activation criteria for the first DC voltage source for various channels. The various types of ROM and RAM may include any number, type and combination of computer readable storage media, such as a disk drive, an electrically programmable read-only memory (EPROM), an electrically erasable and programmable read only memory (EEPROM), a CD, a DVD, a universal serial bus (USB) drive, and the like, which are non-transitory (e.g., as compared to transitory propagating signals).

Figure 3:
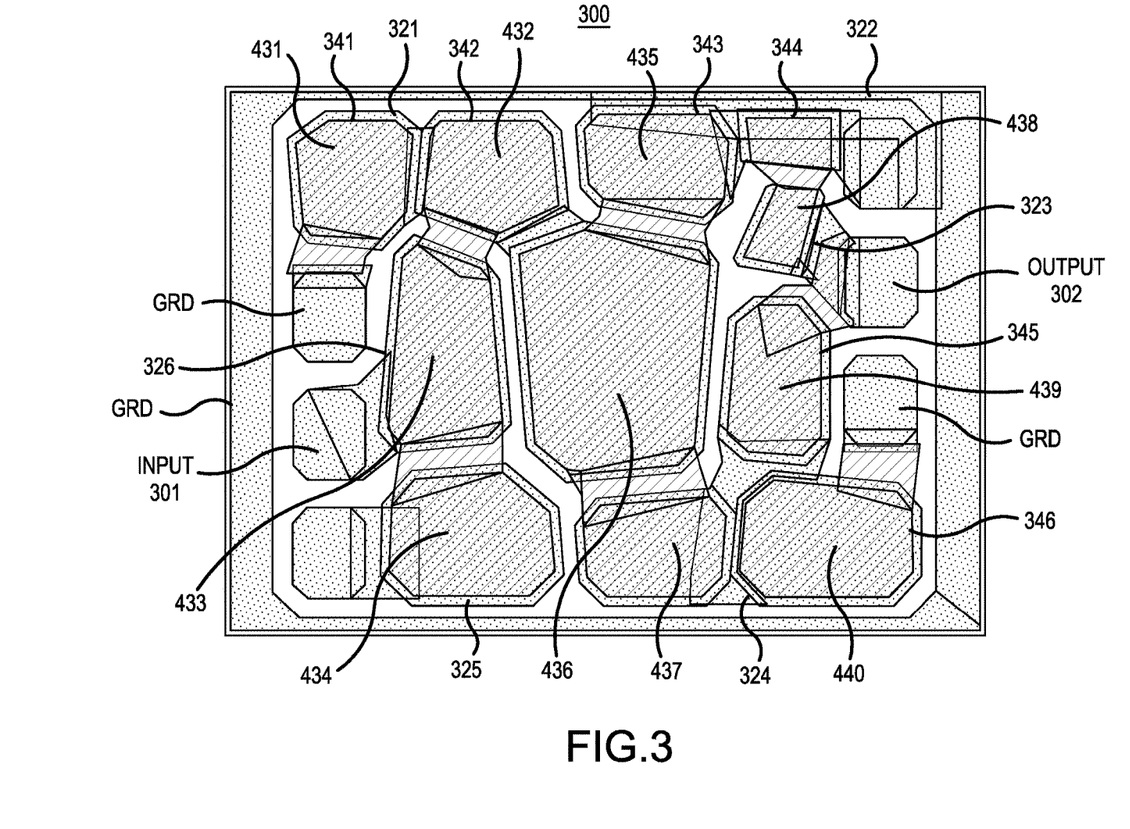
FIG. 3 is a top plan view illustrating an acoustic filter device, including acoustic resonators and DC bias voltage source(s) for shifting resonance frequencies of acoustic resonators and shifting a passband of the acoustic filter device, according to a representative embodiment.

FIG. 3 is a top, partially transparent plan view illustrating an acoustic filter device, including acoustic resonators and DC bias voltage sources for shifting resonance frequencies of acoustic resonators and a passband of the acoustic filter device, according to a representative embodiment.

Referring to FIG. 3, BAW filter device 300 is similar to the BAW filter device 200 discussed with reference to FIG. 2, in that it includes a band pass filter comprising series and shunt connected acoustic resonators in a ladder structure. However, the BAW filter device 300 is shown in layout form as overlapping layers, where the top metal layers are indicated by hatching and the bottom metal layers are indicated by shading. Although not expressly shown, a piezoelectric layer formed of piezoelectric material, as discussed above with reference to piezoelectric layer 130 in FIGS. 1B and 1C, is formed between the top and bottom metal layers. An FBAR is formed in the areas in which a portion of a top metal layer, a portion of the piezoelectric layer and a portion of a bottom metal layer overlap. The piezoelectric layer may be continuous across substantially the entire BAW filter device 300, or may be selectively deposited on the bottom metal layers where needed to form a corresponding FBAR between top and bottom metal layers, without departing from the scope of the present teachings.

More particularly, the BAW filter device 300 includes top metal layers 341, 342, 343, 344, 345 and 346, and bottom metal layers 321, 322, 323, 324, 325 and 326. As discussed above, each of the top metal layers 341 to 346 and the bottom metal layers 321 to 326 is formed of metal with high conductive properties, such as molybdenum (Mo), tungsten (W), aluminum (Al), platinum (Pt), ruthenium (Ru), niobium (Nb), or hafnium (Hf), for example. In the example shown in FIG. 3, the top metal layer 341 overlaps the bottom metal layer 321 to form FBAR 431. The top metal layer 342 overlaps the bottom metal layers 321, 325 and 326 to form FBARs 432, 433 and 434, respectively. The top metal layer 343 overlaps the bottom metal layers 321, 322 and 324 to form FBARs 435, 436 and 437, respectively. Also, the top metal layer 344 overlaps the bottom metal layer 323 to form FBAR 438, the top metal layer 345 overlaps the bottom metal layer 324 to form FBAR 439, and the top metal layer 346 overlaps the bottom metal layer 324 to form FBAR 440.

Each of the top metal layers 341, 342, 343, 344, 345 and 346 is connected to a first DC voltage source (not shown in FIG. 3), such as first DC voltage source 161, 261, through a high resistance layer (not shown in FIG. 3). In the depicted embodiment, each of the top metal layers 341 to 346 can be the top electrode of multiple FBARs, e.g., as many as three FBARs. For example, the top metal layer 342 provides the top electrode for each FBAR 432, 433 and 434, and the top metal layer 343 provides the top electrode for each FBAR 435, 436 and 437. Even when this is the case, each of the top metal layers 341, 342, 343, 344, 345 and 346 needs to be connected just once to the first DC voltage, through a high resistance layer. The signal path through the BAW filter device 300 goes up and down alternately between the top and bottom electrodes of the FBARs 431 to 440 to get from input 301 to output 302 via corresponding signal pads, which in the depicted example are formed from the bottom metal layers 326 and 323, respectively.

Although the high resistance layer is not expressly shown in FIG. 3, it is understood that the high resistance layer is applied at least over the top surfaces of the top metal layers 341, 342, 343, 344, 345 and 346. Thus, the high resistance layer may be continuous across substantially the entire BAW filter device 300, or may be selectively deposited on the top metal layers where needed to form corresponding FBARs, without departing from the scope of the present teachings. When there is a single high resistance layer connecting every top electrode (i.e., every segment of the top metal layer) to the high voltage DC voltage source 161, 261, the same process layer may be used for all the resistors. However, the resistance must be high enough so the different segments of the top metal layer do not have significant coupling at RF frequencies. The same is true for connecting every bottom electrode to the second DC voltage source 162, 262 via a high resistance layer, to the extent the bottom electrodes are not connected directly to ground.

The high resistance layer provides a resistance value high enough to substantially prevent current flow through the high resistance layer (e.g., approximately 100 k$\Omega$ or higher). For example, the high resistance layer provides the resistance for at least the first resistor 151 in FIGS. 1B and 1C, and for the resistors 251, 252, 253, 258 and 259 in FIG. 2. In an embodiment that includes a second DC voltage source 162, 262 connected to one or more of the bottom metal layers, the high resistance layer may also provide the resistance for the second resistor 152 in FIGS. 1B and 1C, and for the resistors 254, 255, 256 and 257 in FIG. 2, connected between the second DC voltage source 162, 262 and the bottom electrodes of the respective FBARs. Alternatively, the resistance for the second resistor 152 in FIGS. 1B and 1C, and for the resistors 254, 255 in FIG. 2, may be provided by one or more other resistance layers (not shown in FIG. 3), have the same or different resistance values, with out departing from the present teachings. When the bottom metal layers 321 to 325 (and thus the bottom electrodes) of the FBARs 431 to 440 in FIG. 3 are directly connected to ground, there is no need for a high resistance layer to be provided between the bottom metal layers 321 to 326 and ground, as discussed above, particularly with reference to FIG. 1C.

Figure 4:
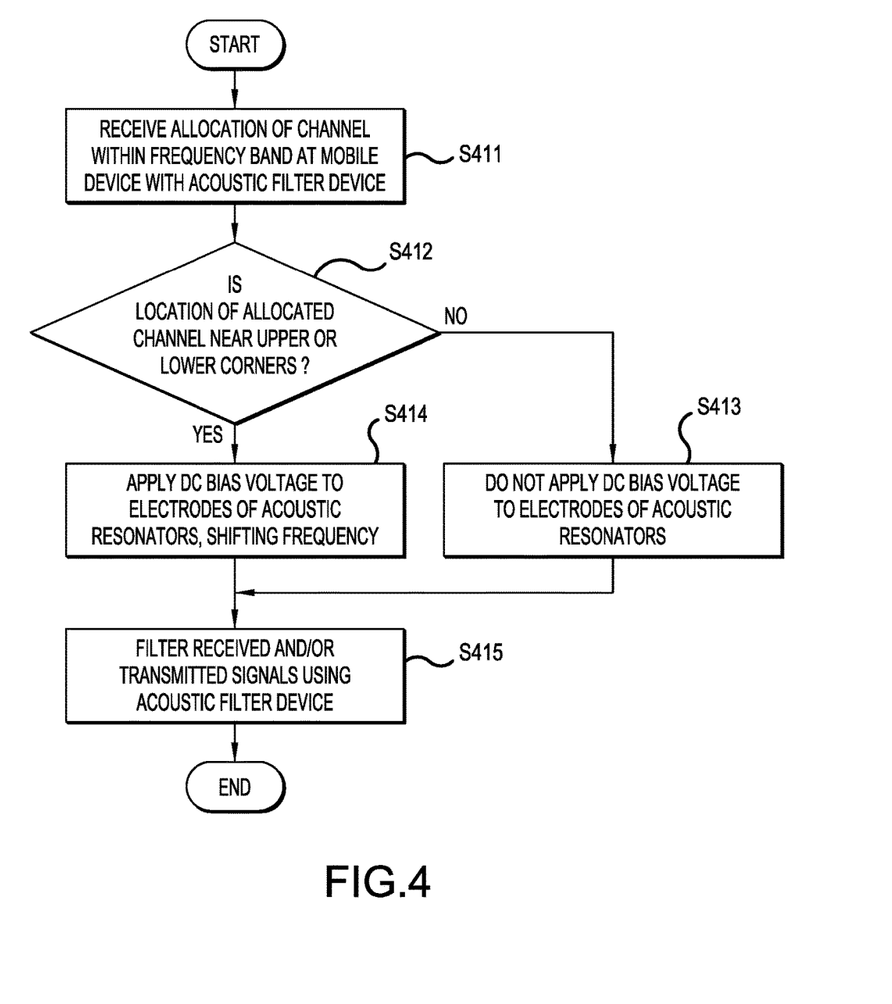
FIG. 4 is a flow diagram illustrating a method for shifting resonance frequencies of acoustic resonators in an acoustic filter device and a passband of the acoustic filter device, according to a representative embodiment.

FIG. 4 is a flow diagram illustrating a method of improving insertion loss of an acoustic band pass filter device, comprising multiple acoustic resonators, operating in an allocated channel of a predetermined frequency band, according to a representative embodiment. In accordance with the method, resonance frequencies of acoustic resonators in the acoustic band pass filter device and a passband of the acoustic band pass filter device are shifted when the allocated channel is near an upper corner or a lower corner of the predetermined frequency band.

Referring to FIG. 4, the method includes receiving a channel allocation at block S411. The channel allocation identifies a particular channel within the predetermined frequency band (e.g., LTE band 25 for purposes of illustration) for use by the mobile device in which the acoustic band pass filter devise is situated. For example, the receive frequency band of LTE band 25 is 1930 MHz-1995 MHz, which is a bandwidth of 65 MHz. Depending on network use and required data rate, LTE band 25 may include channels having bandwidths of 1.4 MHz, 3 MHz, 5 MHz, 10 MHz, 15 MHz or 20 MHz, which translate into 46 channels, 21 channels, 13 channels, 6 channels, 4 channels or 3 channels, respectively, in the receive frequency band. It is one of these channels (from the possible sets of channels) that is allocated to the mobile device and/or the acoustic band pass filter device in block S411.

In block S412, it is determined whether a location of the allocated channel within the predetermined frequency band is near the upper corner or the lower corner of the predetermined frequency band. As discussed above, the allocated channel may be considered near the upper corner or the lower corner of the predetermined frequency band when that channel includes spectrum within approximately the upper or lower ten percent of the frequency band. For example, as mentioned above, the receive frequency band of LTE band 25 is 1930 MHz-1995 MHz, which is a bandwidth of 65 MHz. Since 10 percent of that bandwidth is 6.5 MHz, a channel in the receive frequency band of LTE band 25 is considered to be near the upper corner when it includes spectrum in a range from 1988.5 MHz-1995 MHz, and to be near the lower corner when it includes spectrum in a range from 1930 MHz-1936.5 MHz. This determination may be made remotely from the acoustic band pass filter device, such as by the base station servicing the mobile device in which the acoustic band pass filter device is situated, or locally, such as by the processing unit of the mobile device or associated with the acoustic band pass filter device, as discussed above.

When it is determined that the location of the allocated channel is not near the upper corner or the lower corner of the predetermined frequency band (S412: No), no DC bias voltage is applied to the acoustic resonators in block S413. That is, the DC voltage source configured to provide the DC bias voltage to the acoustic resonators in the acoustic band pass filter device is deactivated (or, left deactivated if already off). Alternatively, a switch selectively connecting the DC voltage source to the acoustic resonators is opened.

When it is determined that the location of the allocated channel is near the upper corner or the lower corner of the predetermined frequency band (S412: Yes), a non-zero DC bias voltage is applied to electrodes of the acoustic resonators through resistor having a high resistance, respectively, in block S414, where the high resistance substantially prevents current flow through the resistors. That is, the DC voltage source is activated, or a switch selectively connecting the DC voltage source to the acoustic resonators is closed. This step may be referred to as detecting that a location of the allocated channel is near the upper or lower corner of the predetermined frequency band. Application of the non-zero DC bias voltage shifts the resonance frequencies of the acoustic resonators toward a center of the predetermined frequency band, which thereby shifts a passband of the acoustic band pass filter, such that a minimum insertion loss portion of the passband shifts to the center frequency of the channel in use, thereby improving the insertion loss of the acoustic band pass filter. At block S415, the acoustic band pass filter filters received and/or transmitted signals, with or without the DC bias voltage, depending on the determination in block S412.

The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. A tunable bulk acoustic wave (BAW) filter device for filtering a radio frequency (RF) signal having a carrier frequency in an allocated channel of a predetermined frequency band having a plurality of predetermined channels, the BAW filter device comprising:
   a first voltage source that selectively provides a non-zero direct current (DC) bias voltage based on a location of the allocated channel within the predetermined frequency band; and
   a plurality of BAW resonators configured to provide a passband of the BAW filter device, each BAW resonator having a corresponding resonance frequency and comprising:
   a bottom electrode disposed over a substrate and an acoustic reflector;
   a piezoelectric layer disposed over the bottom electrode and having a corresponding resonance frequency; and
   a top electrode disposed over the piezoelectric layer, the top electrode being electrically connected to the first voltage source via a first resistor,
   wherein the first voltage source is controlled to apply the non-zero DC bias voltage to the top electrode of each BAW resonator, when the location of the allocated channel is near an upper corner or a lower corner of the predetermined frequency band, the upper corner corresponding to a high frequency edge of the predetermined frequency band and the lower corner corresponding to a low frequency edge of the predetermined frequency band, and
   wherein the resonance frequency of each BAW resonator is shifted in response to the non-zero DC bias voltage toward a center of the predetermined frequency band, shifting a minimum insertion loss portion of the passband of the BAW filter device toward the allocated channel.

2. The BAW filter device of claim 1, wherein each BAW resonator has a voltage coefficient of frequency that determines an amount the resonance frequency is shifted in response to the applied non-zero DC bias voltage.

3. The BAW filter device of claim 1, wherein the non-zero DC bias voltage applied by the first voltage source is positive or negative, depending on a direction the resonance frequency is to be shifted.

4. The BAW filter device of claim 3, wherein zero DC bias voltage is applied to the top electrode of each BAW resonator when the first voltage source is not controlled to apply the non-zero DC bias voltage.

5. The BAW filter device of claim 3, wherein the positive and negative non-zero DC bias voltage is about +90 volts DC and about −90 volts DC.

6. The BAW filter device of claim 3, wherein the positive and negative non-zero DC bias voltage is about +70 volts DC and about −70 volts DC.

7. The BAW filter device of claim 1, wherein the location of the allocated channel is near the upper corner or the lower corner of the predetermined frequency when a the allocated channel includes frequency spectrum in an upper or lower approximately ten percent of the predetermined frequency band.

8. The BAW filter device of claim 1, wherein the location of the allocated channel is near the upper corner or the lower corner of the predetermined frequency when a the allocated channel includes frequency spectrum in an upper or lower approximately five percent of the predetermined frequency band.

9. The BAW filter device of claim 1, further comprising:
a second voltage source that provides zero DC bias voltage to the bottom electrode of each BAW resonator, wherein the zero DC bias voltage comprises an electrical ground or a common voltage.

10. The BAW filter device of claim 1, wherein the first resistor has a resistance value high enough such that the first voltage source has no loading effect on the plurality of BAW resonators at the corresponding resonance frequencies.

11. The BAW filter device of claim 1, further comprising:
a detector configured to determine when the location of the allocated channel is near the upper corner or the lower corner of the predetermined frequency band, and causes the first voltage source to activate to apply the non-zero DC bias voltage, or causes a switch to close, connecting the first voltage source to the top electrode of each BAW resonator to apply the non-zero DC bias voltage.

12. The BAW filter device of claim 11, wherein the detector determines when the location of the allocated channel is near the upper corner or the lower corner of the predetermined frequency band based on a flag in a signal received from a base station servicing a mobile device in which the BAW filter device is located.

13. The BAW filter device of claim 1, wherein the first resistor has a resistance value high enough to isolate each of the corresponding BAW resonators at radio frequencies (RF), and small enough to enable the top electrode of each of the corresponding BAW resonators to reach the non-zero DC bias voltage when the first voltage source is activated.

14. The BAW filter device of claim 1, wherein the top electrode of each of the plurality of BAW resonators is provided by a top metal layer, and the first resistor corresponding to each of the plurality of BAW resonators is provided by a first high resistance layer formed between the top metal layer and the first voltage source.

15. The BAW filter device of claim 1, wherein the first voltage source comprises a charge pump circuit.

16. The BAW filter device of claim 1, wherein the plurality of BAW resonators comprise a plurality of thin film bulk acoustic resonators (FBARs).

17. The BAW filter device of claim 1, wherein the plurality of BAW resonators comprise a plurality of solidly mounted bulk resonators (SMRs).

18. A mobile communications device operating in an allocated channel of a predetermined frequency band having a plurality of predetermined channels, the mobile communication device comprising:
(i) a band pass filter including a plurality of BAW resonators having a corresponding plurality of resonance frequencies, the band pass filter comprising:
a substrate and a plurality of acoustic reflectors corresponding to the plurality of BAW resonators;
a first metal layer formed over the substrate, the first metal layer providing a bottom electrode for each of the plurality of BAW resonators;
a piezoelectric layer formed over the first metal layer;
a second metal layer formed over the piezoelectric layer, the second metal layer providing a top electrode for each of the plurality of BAW resonators; and
(ii) a high impedance voltage bias network comprising:
a voltage source for providing a direct current (DC) bias voltage to the second metal layer;
a high resistance layer formed between the second metal layer and the voltage source, and configured to provide a resistance between each of the plurality of BAW resonators and the voltage source,
wherein the voltage source is activated when a location of the allocated channel within the predetermined frequency band is near an upper corner or a lower corner of the predetermined frequency band, thereby applying the DC bias voltage to the top electrode of each BAW resonator, which causes the resonance frequency of each BAW resonator to shift toward a center of the predetermined frequency band, shifting a minimum insertion loss portion of a passband of the band pass filter toward the allocated channel, wherein the upper corner corresponds to a high frequency edge of the predetermined frequency band and the lower corner corresponds to a low frequency edge of the predetermined frequency band.

19. The mobile communications device of claim 18, wherein the high impedance voltage bias network has no loading effect on the plurality of BAW resonators of the band pass filter at the corresponding plurality of resonance frequencies.

20. A method of improving insertion loss of an acoustic band pass filter, comprising a plurality of bulk acoustic wave (BAW) acoustic resonators, operating in an allocated channel of a plurality of channels in a predetermined frequency band, the method comprising:
detecting when a location of the allocated channel is near an upper corner or a lower corner of the predetermined frequency band; and
activating a direct current (DC) voltage source when the location of the allocated channel is detected as being near the upper corner or the lower corner of the predetermined frequency band, the activated voltage source applying a non-zero DC bias voltage to an electrode of each BAW resonator via a resistor having a high resistance that substantially prevents current flow through the resistor at RF frequencies in a filter passband, wherein application of the non-zero DC bias voltage shifts a resonance frequency of each BAW resonator toward a center of the predetermined frequency band, causing a minimum insertion loss portion of the passband to shift toward a center frequency of the allocated channel.

21. The method of claim 20, wherein the location of the allocated channel is detected as being near the upper corner or the lower corner of the predetermined frequency when the allocated channel includes frequency spectrum in an upper or lower approximately five percent of the predetermined frequency band.

22. The method of claim 20, wherein the location of the allocated channel is detected as being near the upper corner or the lower corner of the predetermined frequency when the allocated channel includes frequency spectrum in an upper or lower approximately ten percent of the predetermined frequency band.

* * * * *